United States Patent
Takezawa et al.

(10) Patent No.: US 6,465,082 B1
(45) Date of Patent: Oct. 15, 2002

(54) STRESS RELAXATION ELECTRONIC PART, STRESS RELAXATION WIRING BOARD, AND STRESS RELAXATION ELECTRONIC PART MOUNTED BODY

(75) Inventors: Hiroaki Takezawa, Katano; Masahide Tsukamoto, Nara; Minehiro Itagaki, Moriguchi; Yoshihiro Bessho, Higashiosaka; Hideo Hatanaka, Katano; Yasushi Fukumura, Sakai; Kazuo Eda, Nara; Toru Ishida, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/554,502

(22) PCT Filed: Nov. 13, 1998

(86) PCT No.: PCT/JP98/05135

§ 371 (c)(1), (2), (4) Date: May 16, 2000

(87) PCT Pub. No.: WO99/26283

PCT Pub. Date: May 27, 1999

(30) Foreign Application Priority Data

Nov. 19, 1997 (JP) .............................. 9-318629

(51) Int. Cl.$^7$ ................................. H05K 1/00
(52) U.S. Cl. ...................... 428/209; 428/327; 428/458; 428/901; 361/748; 361/760; 361/761
(58) Field of Search ................. 428/325, 209, 428/327, 195, 458, 901; 257/778, 779, 783; 361/748, 760, 761

(56) References Cited

U.S. PATENT DOCUMENTS

| | | |
|---|---|---|
| 4,970,575 A | 11/1990 | Soga et al. |
| 6,049,128 A | 4/2000 | Kitano et al. |
| 6,153,938 A * | 11/2000 | Kanda et al. ............. 257/778 |

FOREIGN PATENT DOCUMENTS

| | | |
|---|---|---|
| JP | 55-160072 | 12/1980 |
| JP | 57-113505 | 7/1982 |
| JP | 2-185050 | 7/1990 |
| JP | 5-74857 | 3/1993 |
| JP | 5-275489 | 10/1993 |
| JP | 8-111473 | 4/1996 |
| JP | 8-195466 | 7/1996 |
| JP | 9-148720 | 6/1997 |
| JP | 9-260533 | 10/1997 |

OTHER PUBLICATIONS

Japanese Office Action issued on Aug. 28, 2001 for corresponding Japanese Basic Application.

* cited by examiner

Primary Examiner—Deborah Jones
Assistant Examiner—Stephen Stein
(74) Attorney, Agent, or Firm—Smith, Gambrell & Russell, LLP (57) ABSTRACT

A stress relaxation type electronic component which is to be mounted on a circuit board, wherein a stress relaxation mechanism member is disposed on a surface of said electronic component, said surface being on a side of a connection portion where said electronic component is to be connected to said circuit board, and said stress relaxation mechanism member is electrically conductive.

27 Claims, 9 Drawing Sheets

Fig. 1

13 electronic component
15 stress relaxation mechanism member

STRESS RELAXATION ELECTRONIC PART, STRESS RELAXATION WIRING BOARD, AND STRESS RELAXATION ELECTRONIC PART MOUNTED BODY

TECHNICAL FIELD

The present invention relates to an electronic component such as a semiconductor device, a circuit board for mounting such an electronic component, and the like.

BACKGROUND ART

Conventionally, a plastic QFP (Quad Flat Package) in which input/output lead wires are drawn out from four side faces of a package is often used as a package type semiconductor device. As large scale integration of an electronic component such as a semiconductor device advances in accordance with increase of functions and enhancement of performance of an electronic apparatus in various fields, the number of input/output terminals is increased and this increase inevitably causes also the package shape of a QFP to expand. In order to solve this problem, the design rule of a semiconductor chip is set to a very fine level, and the lead pitch is narrowed, so that requests for miniaturization and thinning of electronic apparatuses of various kinds are satisfied.

In an LSI of a scale of 400 pins or more, however, even when the pitch is narrowed, such requests cannot be sufficiently fulfilled because of, for example, a problem in mass productivity of soldering. Moreover, there is a problem which inevitably arises in the case where an electronic component such as a semiconductor device package is mounted on a circuit board. Namely, this problem is caused by a difference in coefficient of thermal expansion between the electronic component and the circuit board. It is very difficult to connect with high reliability many input/output leads of an electronic component to a large number of electrode terminals on a circuit board having a coefficient of thermal expansion which is different from that of the electronic component. Furthermore, input/output leads which are prolonged as a result of enlargement of a plastic QFP cause a problem in that the signal transmission rate is lowered.

In order to solve many such problems involved in a plastic QFP, recently, attention is given to a semiconductor device which, unlike a QFP, has no lead pin, such as a BGA (Ball Grid Array) in which spherical connection terminals are arranged in a two-dimensional array-like manner on the rear face of a semiconductor device package, or an LGA (Land Grid Array) or CSP (Chip Size Package) in which many flat electrodes are arranged in an array-like manner on the rear face of a semiconductor device package.

In such a semiconductor device, external connection electrodes of a chip carrier are arranged in a lattice-like manner on the rear face of the chip carrier. Therefore, the semiconductor device can be miniaturized, so that a larger number of electronic components and the like can be mounted in a high density. Consequently, such a semiconductor device can largely contribute also to a miniaturized electronic apparatus. Since such a semiconductor device has no lead, connections between the semiconductor device and a circuit board can be shortened and hence the signal processing rate can be improved.

However, even a BGA of the prior art having such a structure cannot solve the problems of destruction of a package and a connection failure which are caused by a difference in coefficient of thermal expansion when the package is mounted on a circuit board and then soldered thereto. Furthermore, a BGA has a problem in that it cannot withstand reliability tests such as a thermal shock test. For example, the coefficient of thermal expansion of a chip carrier which is mainly made of ceramics is largely different from that of a circuit board which consists of glass fibers and a resin. Therefore, a great stress is generated in the connection portion and the reliability of the connection is lowered.

Figure 15:
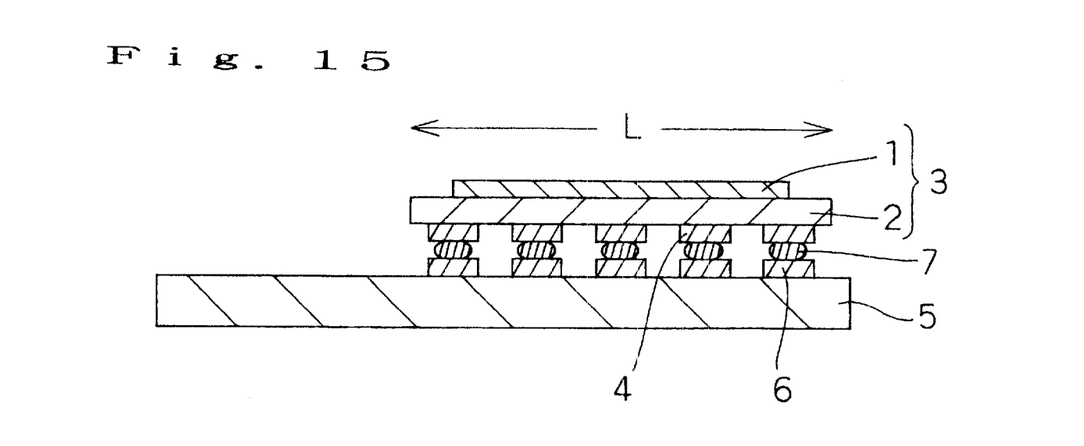
FIG. 15 is a section view of an electronic component mounted member of the prior art.

FIG. 15 shows a connection structure in the prior art in the case where an electronic component such as a semiconductor device is to be connected to a circuit board. Electrodes 4 of an electronic component 3 in which an LSI chip 1 is mounted on a ceramic carrier 2 are connected to electrodes 6 of a circuit board 5 by means of solder 7. In this connection structure, the coefficient of thermal expansion of the ceramic carrier 2 of the electronic component 3 is largely different from that of the circuit board 5 which is made of a synthetic resin, etc. As the dimension L of the electronic component 3 is larger, therefore, a great stress is generated in the connection portion and a danger of destroying the connection portion is increased. Consequently, materials which can be used in an electronic component or a circuit board are largely restricted.

This will be described more specifically. Generally, the material constituting the ceramic carrier 2 on which the LSI chip 1 is mounted is largely different from that constituting the circuit board 5, and hence their coefficients of thermal expansion greatly differ from each other. Glass-epoxy resin which is often used as the circuit board 5 has a coefficient of thermal expansion of about $15 \times 10^{-6}$. By contrast, the coefficient of thermal expansion of the whole of the package of the ceramic carrier 2 including the LSI chip 1 is about 2 to $5 \times 10^{-6}$. When the electronic component or an MCM has a size of 30 mm square, in the case of a temperature difference of 200° C., a dimensional difference of several tens of midrometers is generated in the connection portion between the electronic component and the circuit board as compared with the case of ordinary temperature. A stress due to the difference causes the connection portion and a weak portion of wiring conductors to be destroyed.

DISCLOSURE OF INVENTION

The invention has been conducted in order to solve the problems of the prior art. It is an object of the invention to provide a stress relaxation type electronic component, a stress relaxation type circuit board, and a stress relaxation type electronic component mounted member in which destruction of a package or a connection portion due to a difference in coefficient of thermal expansion between an electronic component such as an LSI chip or a semiconductor device package and a circuit board can be prevented from occurring.

According to the invention, in an electronic component which is to be mounted on a circuit board, a stress relaxation mechanism member is disposed on a surface of the electronic component, the surface being on a side of a connection portion where the electronic component is to be connected to the circuit board. The invention has a function that, during a thermal shock test, a stress generated owing to a difference in coefficient of thermal expansion is absorbed by the stress relaxation mechanism member. Therefore, a semiconductor device itself or a portion such as a connection portion between the semiconductor device and the circuit board is prevented from being destroyed, and the reliability of the connection of the semiconductor device and an electronic apparatus can be improved.

In the invention, a solderable layer is on a surface on a side where the stress relaxation mechanism member is connected to the circuit board. It is possible to improve the reliability of the connection of the circuit board and the electronic component.

In the invention, the solderable layer consists of copper foil, or a metal which is formed by thermally decomposing an organometallic complex film. It is possible to produce at a low cost an electronic component having excellent reliability in connection.

In the invention, the stress relaxation mechanism member is formed by an electrically conductive adhesive agent. The electronic component can be produced by a relatively simple method and at a low cost.

In the invention, the stress relaxation mechanism member is formed by a solderable electrically conductive adhesive agent. It is possible to provide at a low cost an electronic component in which the solderability and the electrical conductivity can be improved, and which has excellent reliability in connection.

In the invention, the stress relaxation mechanism member is configured by an electrode which is previously formed on the electronic component. It is possible to produce an electrode having a stress relaxation mechanism member.

The invention is further characterized in that the electrode is made of an electrically conductive resin composition. It is possible to produce at a relatively low cost an electrode having a stress relaxation mechanism member.

In the invention, the electrically conductive resin composition contains, as main components, an electrically conductive filler, a thermosetting resin, and expandable hollow synthetic resin particles. The stress relaxation mechanism member is provided by forming an elastic ball-like hollow portion inside the electrically conductive resin composition.

In the invention, an electrically conductive adhesive agent for forming a stress relaxation mechanism member is further formed on an upper face of the electrode. The stress relaxation function can be exerted more effectively.

Another embodiment of the invention is characterized in that, in a circuit board on which an electronic component is to be mounted, a stress relaxation mechanism member is disposed on a surface of the circuit board on which the electronic component is to be mounted. The invention has a function that, during a thermal shock test, a stress generated owing to a difference in coefficient of thermal expansion is absorbed by the stress relaxation mechanism member. Therefore, a semiconductor device itself or a connection portion between the semiconductor device and the circuit board is prevented from being destroyed, and the reliability of the semiconductor device and an electronic apparatus can be improved.

Another embodiment is characterized in that, in a circuit board on which plural electronic components are to be mounted, a stress relaxation mechanism member is previously disposed on a surface portion of the circuit board on which the electronic components, are to be mounted. Even when plural electronic components having any coefficient of thermal expansion are mounted on the circuit board, it is possible to maintain high reliability in connection.

Yet another embodiment is characterized in that the plural electronic components have different sizes or different shapes. Even when electronic components which are to be mounted have any dimension and shape, it is possible to mount the electronic components by while maintaining excellent reliability in connection.

In the invention, the stress relaxation mechanism member is configured by a layer which can be soldered to a surface on the side where the electronic component is to be mounted. It is possible to improve the reliability of connection of the circuit board and the electronic component.

In the invention, the, solderable layer consists of copper foil, or a metal which is formed by thermally decomposing an organometallic complex film. It is possible to provide at a low cost an electroinic component which has excellent reliability in connection.

In the invention, the stress relaxation mechanism member is formed by an electrically conductive adhesive agent. The circuit board can be produced by a relatively simple method and at a low cost.

In the invention, the stress relaxation mechanism member is formed by a solderable electrically conductive adhesive agent. It is possible to provide at a low cost an electronic component in which the solderabity and the electrical conductivity can be improved, and which has excellent reliability in connection.

In the invention, the stress relaxation mechanism member is configured by an electrode which is previously formed on the circuit board. It is possible to produce an electrode having a stress relaxation mechanism.

The invention is further characterized in that the electrode is configured by of an electrically conductive resin composition. An electrode having a stress relaxation mechanism can be produced by a simple process.

In the invention, the electrically conductive resin composition contains, as main components, at least an electrically conductive filler, a thermosetting resin, and expandable hollow synthetic resin particles. The stress relaxation mechanism member is provided by forming an elastic ball-like hollow portion inside the electrically conductive resin composition.

The invention is further characterized in that an electrically conductive adhesive agent for forming a stress relaxation mechanism member is further formed on an upper face of the electrode. The stress relaxation function can be exerted more effectively. In place of such a stress relaxation mechanism member, a solder layer may be formed on the upper face of the electrode. In this case, a subsequent repair work can be easily conducted.

The invention is further characterized in that an electronic component is mounted on a circuit board via a stress relaxation mechanism member. It is possible to provide an electronic component mounted member which can be applied to an electronic apparatus that will be used in severe environmental conditions.

The invention is further characterized in that the stress relaxation mechanism member is formed by an electrically conductive adhesive agent and a solder layer. An electronic component mounted member having a stress relaxation function can be formed by a relatively easy process and at a lower cost.

The invention is further characterized in that the stress relaxation mechanism member functions also as an electrode. An electrode having a stress relaxation mechanism can be easily produced.

The invention is further characterized in that the stress relaxation mechanism member is configured by an electrode made of an electrically conductive resin composition disposed on the electronic component and/or the circuit board, and at least one of an electrically conductive adhesive agent and a solder layer. It is possible to improve the reliability of connection of the electronic component mounted member.

The invention is further;characterized in that the electronic component consists of plural electronic components having different sizes or different shapes. Even when electronic components which are to be mounted have any dimension and shape, it is possible in any case to obtain an electronic component mounted member which has excellent reliability in connection.

The invention is further characterized in that the electrically conductive adhesive agent and the solder layer are connected to each other via a solderable layer. When an electronic component is mounted on a circuit board, it is possible to attain excellent solderability.

LEGEND OF THE REFERENCE NUMERALS

| 11 | LSI chip |
|---|---|
| 12 | ceramic carrier |
| 13 | electronic component |
| 14, 19, 22, 35 | electrode |
| 15, 19, 20, 24 | stress relaxation mechanism member |
| 15 | electrically conductive paste |
| 16, 31 | solderable layer |

-continued

| 21, 27, 28, 34 | circuit board |
|---|---|
| 25, 26 | connection portion |

BEST MODE FOR CARRYING OUT THE INVENTION

Hereinafter, a first embodiment of the stress relaxation type electronic component of the invention will be described with reference to the accompanying drawings.

Figure 1:
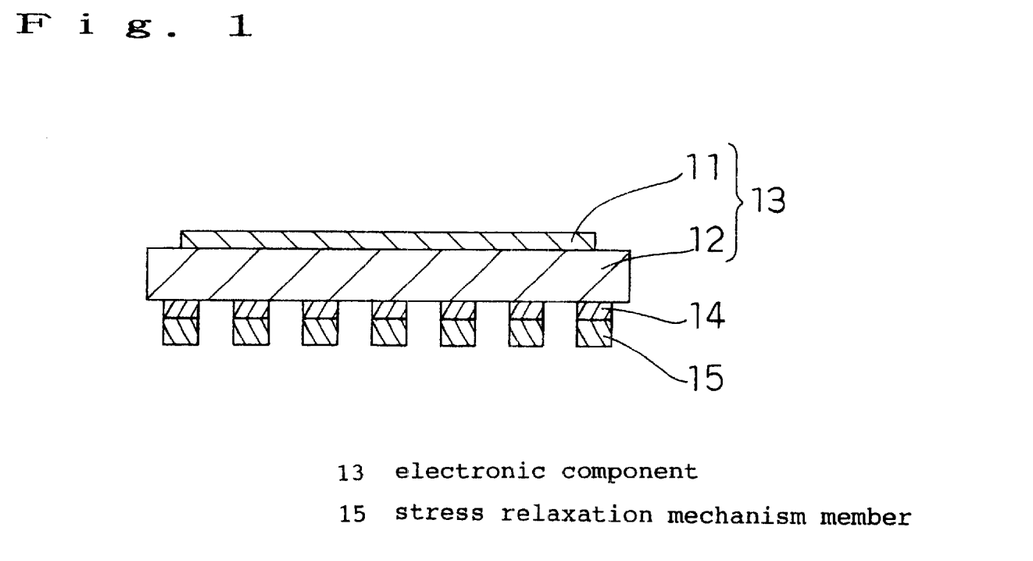
FIG. 1 is a section view of a stress relaxation type electronic component of a first embodiment of the invention.

FIG. 1 shows the configuration of a stress relaxation type electronic component of the first embodiment of the invention. Electrodes 14 which are to be connected to a circuit board are disposed on the lower face of an electronic component 13 consisting of a ceramic carrier 12 on which an LSI chip 11 is to be mounted. The reference numeral 15 denotes a stress relaxation mechanism member which is formed by an electrically conductive adhesive agent consisting of a mixture of an electrically conductive filler such as copper powder or silver powder, and a synthetic resin material. The conductive adhesive agent constituting the stress relaxation mechanism member 15 in the embodiment may be an electrically conductive adhesive agent having a property that soldering can be directly performed on the surface.

In this way, the stress relaxation mechanism member 15 formed by the conductive adhesive agent is disposed on each of connection portions such as the electrodes 14 on the side of the electronic component 13 where the component is to be mounted on the circuit board. As a result, a stress which, when the temperature is raised, is generated owing to a difference in coefficient of thermal expansion between the electronic component 13 and the circuit board is absorbed by the elasticity of the stress relaxation mechanism member 15, so that failures such as destruction of the electronic component, breakage of the connection portions, or peeling of a wiring conductor from the circuit board are prevented from occurring.

Figure 2:
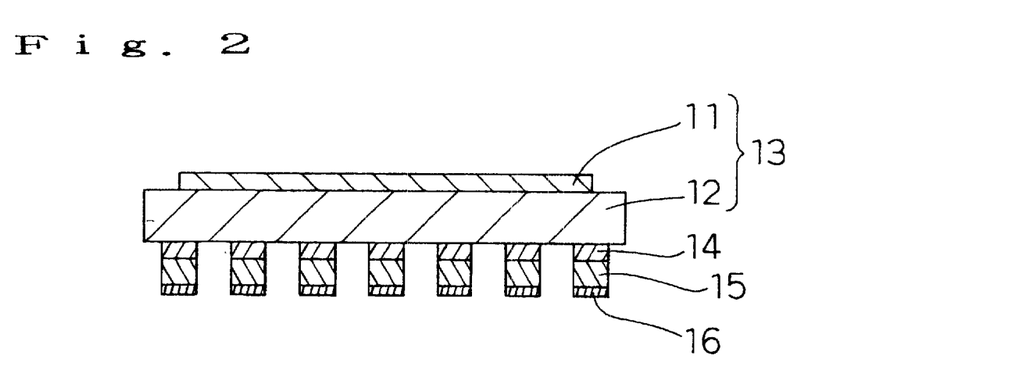
FIG. 2 is a section view of a stress relaxation type electronic component of a second embodiment of the invention.
Figure 3:
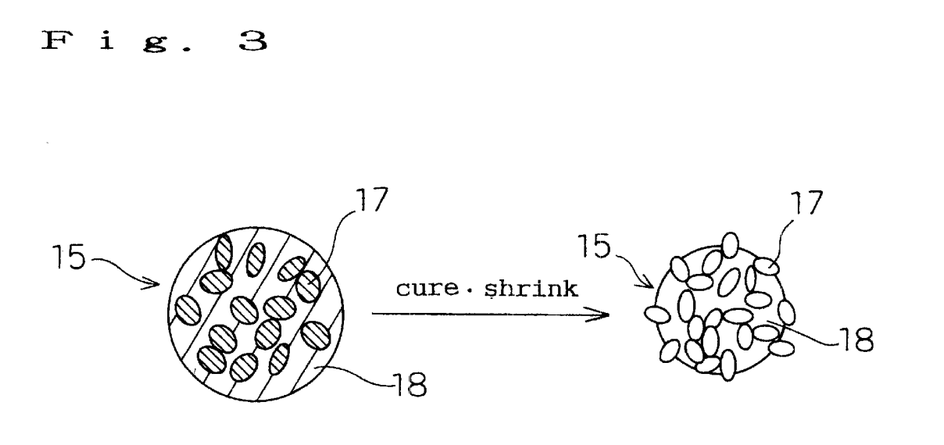
FIG. 3 is a section view of a solderable electrically conductive adhesive agent in the embodiment.

FIG. 3 illustrates in more detail the conductive adhesive agent 15 which is solderable and which has been described in the first embodiment. As a specific example of the conductive adhesive agent, S-5000 manufactured by MITSUI KINZOKU TORYO KAGAKU K.K. will be described. FIG. 3(a) shows a part of the conductive adhesive agent 15 (also referred to as conductive paste) which is in an uncured state. An electrically conductive filler 17 such as copper powder is sealed up in a synthetic resin material 18 which is uncured and fluid, so as to be in a nonconductive state. The conductive adhesive paste 15 is applied to the electrodes 14 as shown in FIG. 1 or 2, and then heat-cured at about 160° C. for 30 minutes, whereby the synthetic resin 18 greatly shrinks, so that the volume of the resin becomes smaller than the accumulated volume of the conductive filler 17. This causes the packing density of the conductive filler 17 in the conductive adhesive paste 15 to be extremely increased, whereby particles of the conductive filler 17 are strongly contacted with each other so as to exert electrical conductivity. At the same, as shown in FIG. 3(b), part of the conductive filler 17 is exposed from the cured conductive adhesive paste 15, so that direct soldering is enabled.

Another specific example of the solderable conductive adhesive agent 15 is disclosed in Japanese Patent Publication (Kokai) No. SH055-160072. Namely, it is possible to use an electrically conductive adhesive agent made of:

powder of electrolytic copper which is excellent in electrical conductivity and dispersibility; non-eutectic solder powder which is in a semi-molten state at the curing temperature of a resin; a thermosetting resin; and an active agent. A further specific example is disclosed in Japanese Patent Publication (Kokai) No. SH057-113505. Namely, electrically conductive paste in which copper powder the surface of which is plated, and solder powder are used as an electrically conductive filler is used, and a binding resin consisting of an epoxy resin and the like, an active agent, and a solvent are added to the filler and kneaded.

FIG. 2 shows the configuration of a stress relaxation type electronic component of a second embodiment of the invention. The basic configuration of the embodiment is identical with that of the first embodiment, and hence different points will be described.

In the embodiment, the stress relaxation mechanism member 15 consisting of an electrically conductive adhesive agent is formed on the electrodes 14 of the electronic component 13. A solderable layer 16 is separately disposed on a surface of the stress relaxation mechanism member 15 on the side where the component is to be connected to the circuit board. As the solderable layer 16, copper foil may be used. Alternatively, as the solderable layer 16, a deposited metal may be used which is obtained by contacting a metal complex solution in which a complex of a metal, for example, Pd, Au, or Pt is dissolved in an organic solvent such as toluene, xylene, or alcohol, with the conductive adhesive agent of the stress relaxation mechanism member 15, and then depositing the metal oh the contact interface. When such a deposited metal is used, it is possible to improve reliability of connection. The use of such a deposited metal has another advantage that the pasting of the metal complex solution enables the solderable layer 16 to be formed on the surface of the stress relaxation mechanism member 15 in a relatively easy manner by using a conventional printing method.

Figure 4:
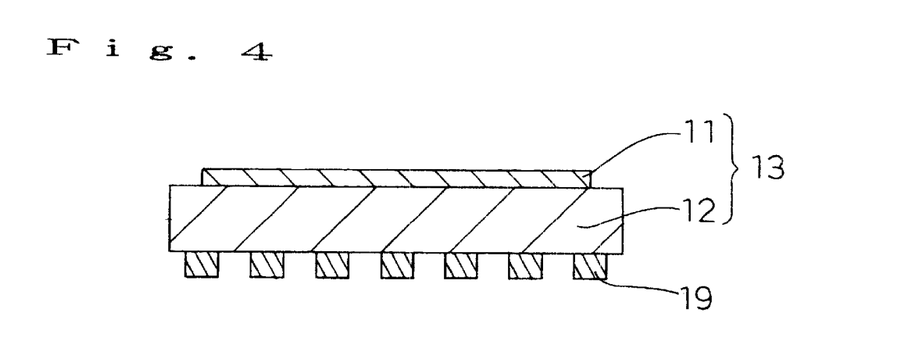
FIG. 4 is a section view of a stress relaxation type electronic component of a third embodiment of the invention.

Next, a third embodiment of the invention will be described. FIG. 4 shows the configuration of a stress relaxation type electronic component of the third embodiment of the invention. The embodiment is identical with the first and second embodiments in that the LSI chip 11 is mounted on the ceramic carrier 12 to form the electronic component 13, and is different in that, in the embodiment, electrodes 19 themselves which are disposed on the side where the electronic component 13 is connected to the circuit board is configured by a stress relaxation mechanism member. Particularly, the embodiment is characterized in that an electrically conductive resin composition containing, as main components, an electrically conductive filler, a thermosetting resin, and expandable hollow synthetic resin particles is used as a material constituting the stress relaxation mechanism member 19.

Figure 5:
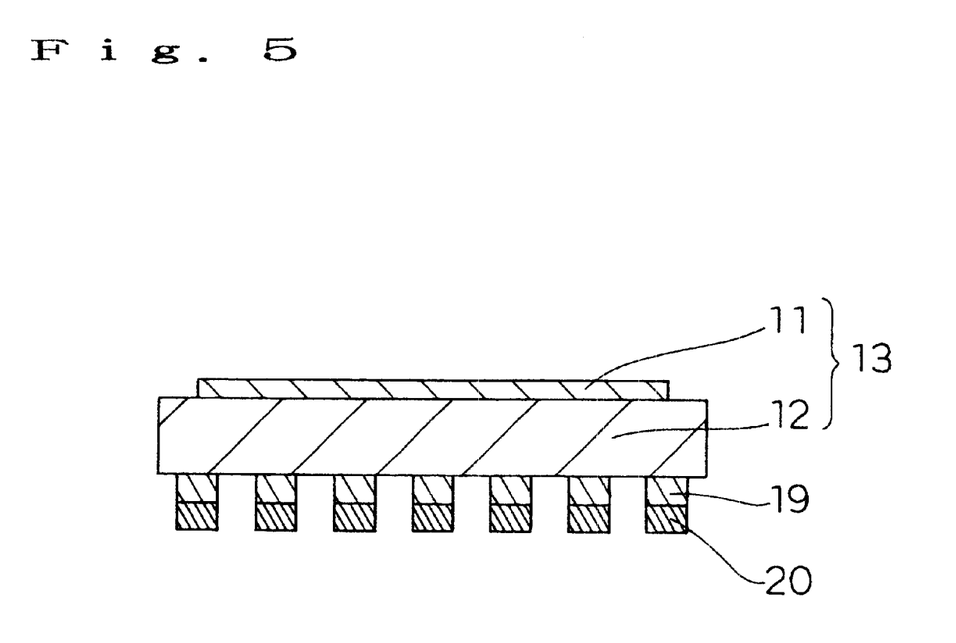
FIG. 5 is a section view of a stress relaxation type electronic component of a fourth embodiment of the invention.

Next, a fourth embodiment of the invention will be described. FIG. 5 shows the configuration of a stress relaxation type electronic component of the fourth embodiment of the invention. The stress relaxation type electronic component of the embodiment is different from the third embodiment in that a stress relaxation mechanism member 20 made of an electrically conductive adhesive agent is further formed on the upper face of each of the electrodes 19 which are stress relaxation mechanism members disposed on the electronic component 13. According to this configuration, the connection portion between the electronic component 13 and the circuit board is provided with a double stress relaxation mechanism, and hence reliability of connection is further improved.

Figure 6:
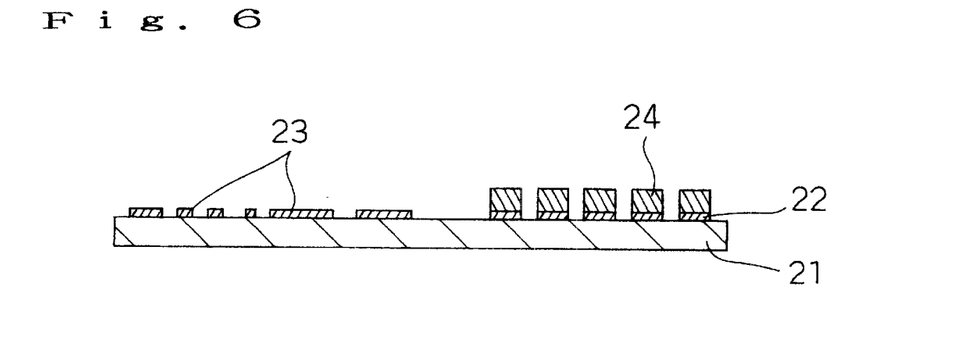
FIG. 6 is a section view of a stress relaxation type circuit board of a fifth embodiment of the invention.

Next, a stress relaxation circuit board of a fifth embodiment of the invention will be described with reference to the accompanying drawings. FIG. 6 shows the configuration of a stress relaxation type circuit board of the fifth embodiment of the invention. As shown in the figure, electrodes 22 which, when an electronic component is mounted, are to be connected to electrodes of the electronic component, and wirings 23 for forming electronic circuits are formed on the upper face of the circuit board 21. A stress relaxation mechanism member 24 which is made of an electrically conductive adhesive agent or an electrically conductive adhesive agent that is solderable is disposed on the surface of each of the electrodes 22. In this way, a stress relaxation mechanism member 24 made of the electrically conductive adhesive agent is disposed in a connection portion such as the electrode 22, on the side of the circuit board 21 where the electronic component is to be mounted. As a result, a stress which, when the temperature is raised, is generated owing to a difference in coefficient of thermal expansion between the electronic component and the circuit board 21 is absorbed by the elasticity of the stress relaxation mechanism member 24, so that failures such as destruction of the electronic component, breakage of the connection portions, or peeling of a wiring conductor from the circuit board 21 are prevented from occurring.

Figure 7:
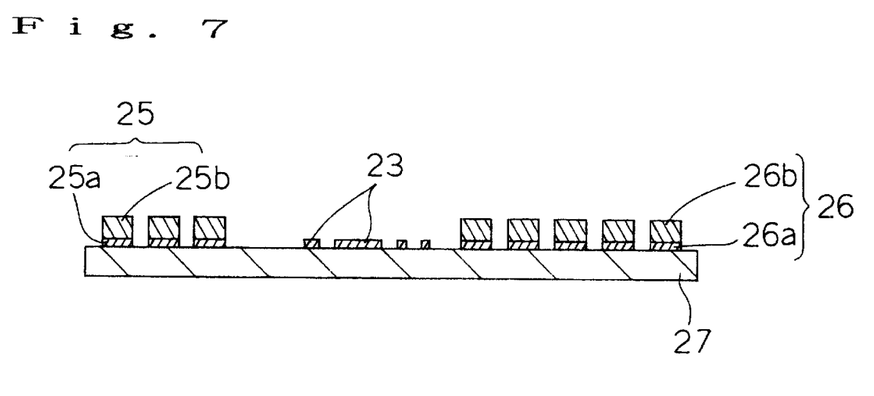
FIG. 7 is a section view of a stress relaxation type circuit board of another example of the fifth embodiment.

FIG. 7 is a section view of a stress relaxation circuit board 27 on which plural electronic components having different sizes or different shapes, for example, a logic LSI and a memory chip. The circuit board 27 comprises connection portions 25 and 26 for mounting and connecting plural electronic components. Each of the connection portions 25 is configured by an electrode 25a and a stress relaxation mechanism member 25b, and each of the connection portions 26 by an electrode 26a and a stress relaxation mechanism member 26b. Even when a large number of high function semiconductor devices having a large size, large active circuit components such as MCMs (Multi-Chip Modules) on which plural semiconductor chips are mounted, small passive circuit components typified by cylindrical chip resistors and chip capacitors, and the like are mounted, therefore, the circuit board of the embodiment can attain high reliability of connection.

Figure 8A:
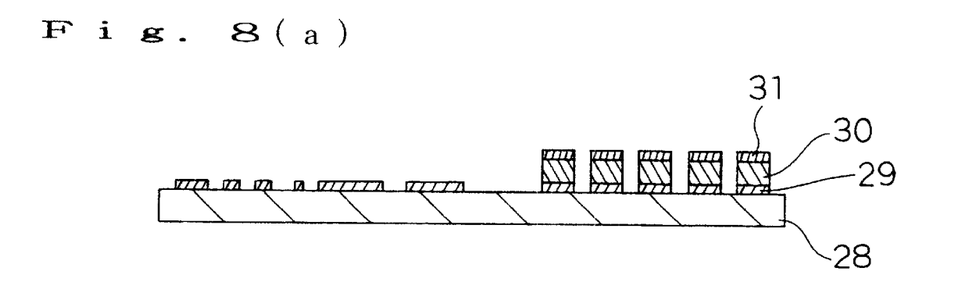
FIGS. 8(a) and 8(b) are section views of a stress relaxation type circuit board of a sixth embodiment of the invention.
Figure 8B:
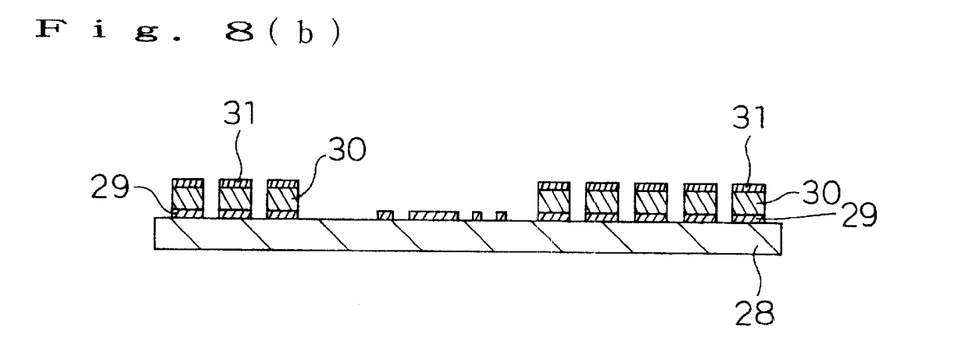

Next, a stress relaxation circuit board of a sixth embodiment of the invention will be described. FIG. 8(a) shows a stress relaxation type circuit board on which a single electronic component is to be mounted, and FIG. 8(b) shows a stress relaxation type circuit board on which plural electronic components are to be mounted. The basic configuration of the embodiment is identical with that of the fifth embodiment, and hence different points will be described.

In the embodiment, a stress relaxation mechanism member 30 consisting of an electrically conductive adhesive agent is formed on electrodes 29 of a circuit board 28. A solderable layer 31 is separately disposed on a surface of the stress relaxation mechanism member 30 on the side where the member is to be connected to the electronic component. In the same manner as the stress relaxation type electronic component of the second embodiment of the invention, copper foil may be used as the solderable layer 31. Alternatively, as the solderable layer 31, a deposited metal may be used which is obtained by contacting a metal complex solution in which a complex of a metal, for example, Pd, Au, or Pt is dissolved in an organic solvent such as toluene, xylene, or alcohol, with the conductive adhesive agent of the stress relaxation mechanism member 30, and then depositing the metal on the contact interface. When such a deposited metal is used, it is possible to improve reliability of connection. It is a matter of course that the same configuration may be employed also in the case of FIG. 8(b) in which plural electronic components are mounted.

Figure 9:
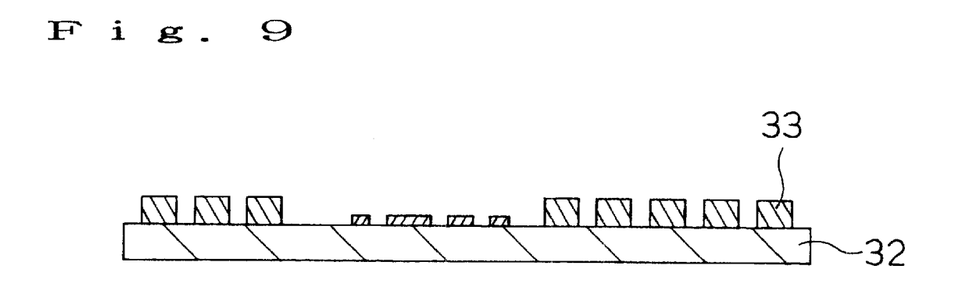
FIG. 9 is a section view of a stress relaxation type circuit board of a seventh embodiment of the invention.

Next, a stress relaxation circuit board of a seventh embodiment of the invention will be described with reference to FIG. 9.

Also in the embodiment, a single electronic component or plural electronic components may be mounted. However, the figure shows only an example in which plural electronic components are mounted. FIG. 9 shows a section of the stress relaxation type circuit board of the embodiment. In the embodiment, each electrode 33 itself which is on a circuit board 32 and to be connected to an electronic component is configured by a stress relaxation mechanism member. Particularly, an electrically conductive resin composition containing, as main components, an electrically conductive filler, a thermosetting resin, and expandable hollow synthetic resin particles is used as a material constituting the stress relaxation mechanism member 32.

Figure 10:
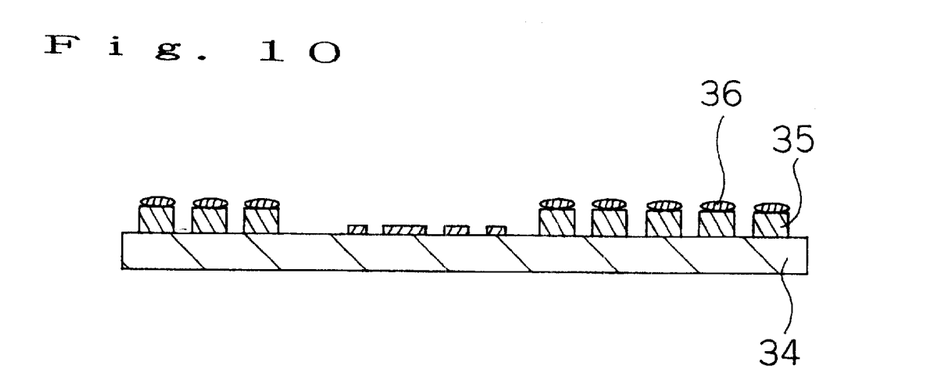
FIG. 10 is a section view of a stress relaxation type circuit board of an eighth embodiment of the invention.

Next, a stress relaxation circuit board of an eighth embodiment of the invention will be described with reference to FIG. 10. The embodiment is different from the seventh embodiment in that a further electrically conductive adhesive agent or a solder layer 36 is disposed on the upper face of each electrode 35 which is disposed on a circuit board 34 and configured by a stress relaxation mechanism member. The existence of the stress relaxation mechanism member can improve reliability of connection with an electronic component, and that of the solder layer enables a repair work to be easily conducted.

Figure 11A:
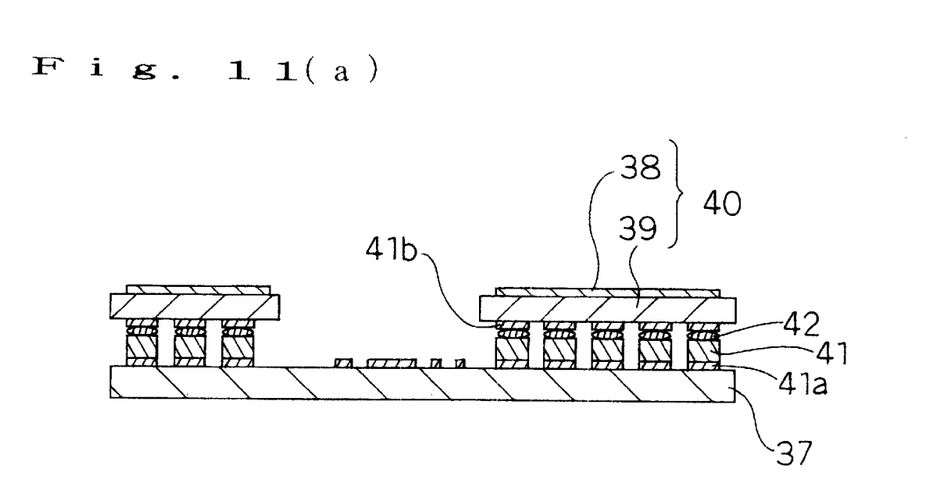
FIGS. 11(a) and 11(b) are section views of a stress relaxation type electronic component mounted member of a ninth embodiment of the invention.
Figure 11B:
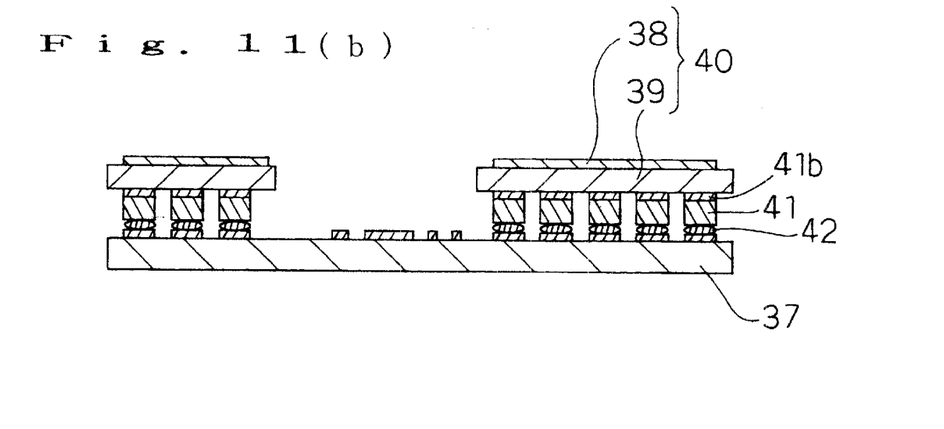

Next, a stress relaxation type electronic component mounted member of a ninth embodiment of the invention will be described. FIGS. 11(a) and 11(b) are section views showing the structure of the stress relaxation type electronic component mounted member of the ninth embodiment on which plural electronic components are to be mounted. A connection portion between a circuit board 37 and an electronic component 40 consisting of an LSI chip 38 and a ceramic carrier 39 is configured by their electrodes 41a and 41b, an electrically conductive adhesive agent 41 which is a stress relaxation mechanism member sandwiched between the electrodes 41a and 41b, and a solder layer 42. FIG. 11(a) shows a case where the conductive adhesive agent 41 serving as a stress relaxation mechanism member is disposed on the upper face of the electrode 41a of the circuit board 37, and FIG. 11(b) a case where the conductive adhesive agent 41 serving as a stress relaxation mechanism member is disposed on the upper face of the electrode 41b of the electronic component 40.

Figure 12:
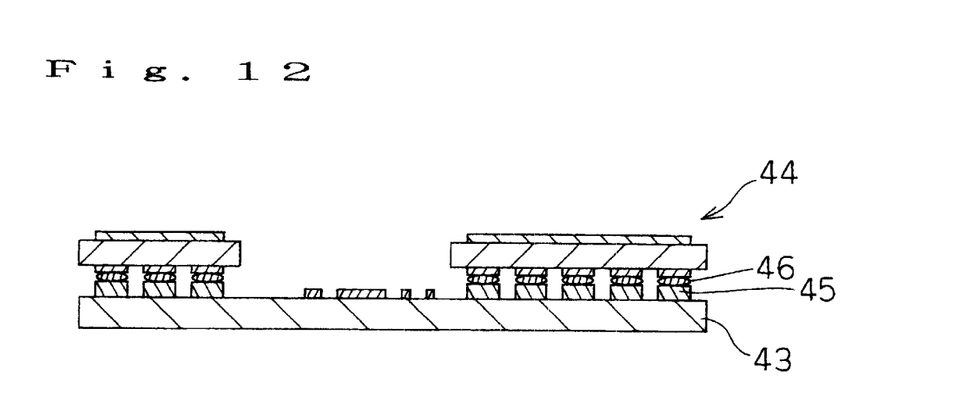
FIG. 12 is a section view of a stress relaxation type electronic component mounted member of a tenth embodiment of the invention.

FIG. 12 shows the sectional structure of a stress relaxation type electronic component mounted member of a tenth embodiment of the invention. An electrode 45 disposed on a circuit board 43, and a solder layer 46 are arranged between the circuit board 43 and an electronic component 44. The electrode 45 is made of an electrically conductive resin composition serving as a stress relaxation mechanism member.

Figure 13:
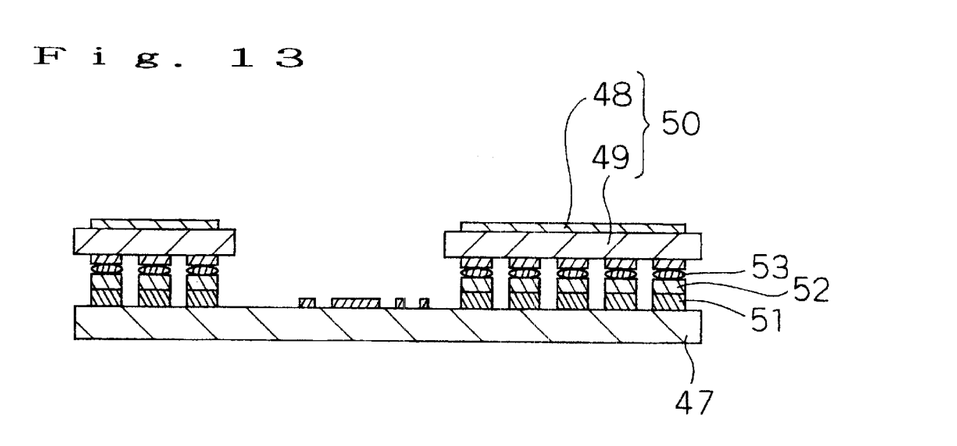
FIG. 13 is a section view of a stress relaxation type electronic component mounted member of an eleventh embodiment of the invention.

Next, a stress relaxation type electronic component mounted member of an eleventh embodiment of the invention will be described. FIG. 13 is a section view showing the structure of the stress relaxation type electronic component mounted member of the eleventh embodiment on which plural electronic components are to be mounted. In a connection portion between a circuit board 47 and an electronic component 50 consisting of an LSI chip 48 and a ceramic carrier 49, there are an electrode 51 which is made of an electrically conductive resin composition and disposed on the circuit board 47, an electrically conductive adhesive agent 52 which is disposed on the upper face of the electrode, and a solder layer 53 which is disposed on the upper face of the conductive adhesive agent. The electrode 51 and the conductive adhesive agent 52 simultaneously constitute a stress relaxation-mechanism member.

Figure 14:
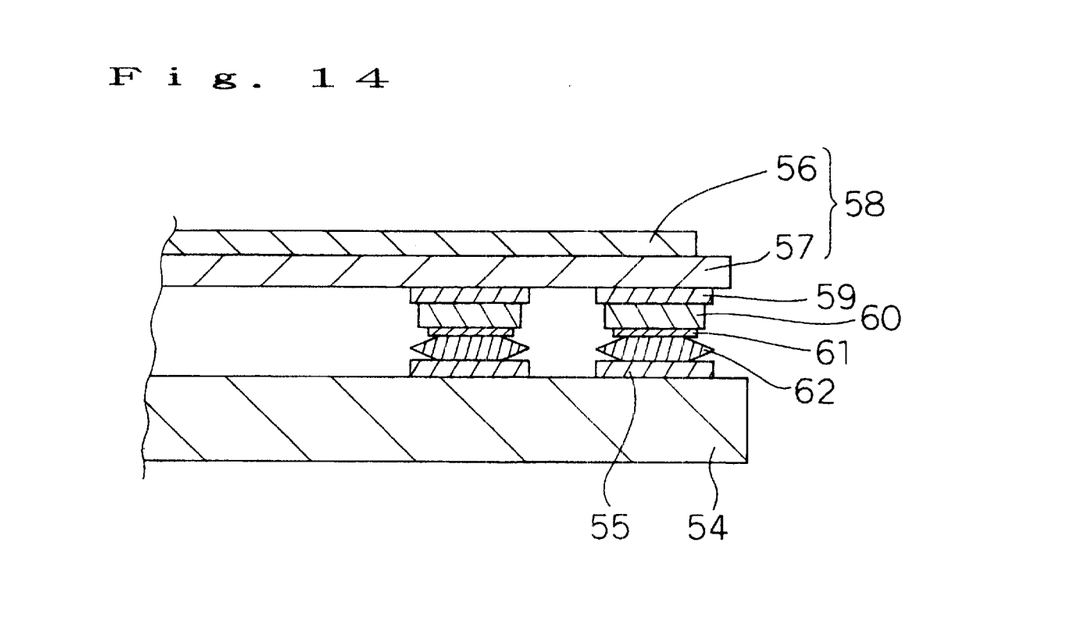
FIG. 14 is a partial enlarged section view of a stress relaxation type electronic component mounted member of a twelfth embodiment of the invention.

Next, a stress relaxation type electronic component mounted member of a twelfth embodiment of the invention will be described. FIG. 14 is an enlarged section view showing a part of the stress relaxation type electronic component mounted member of the embodiment. In a connection portion between an electrode 55 of a circuit board 54 and An electrode 59 of an electronic component 58 consisting of an LSI chip 56 and a ceramic carrier 57, arranged are an electrically conductive adhesive agent 60 constituting a stress relaxation mechanism member, a solderable layer 61, and a solder layer 62.

In the embodiment, a stress generated by a change in the heat environment is absorbed by the electrically conductive adhesive aqent 60 constituting a stress relaxation mechanism member, or the electronic component 58 and the circuit board 54 are firmly connected to each other by the solderable layer 61 and the solder layer 62. When the embodiment is employed in an electronic apparatus to be used in severe environmental conditions, therefore, it is possible to maintain very high reliability.

Industrial Applicability

As apparent from the above description, according to the invention, in a process of soldering an electronic component to a circuit board, a thermal shock test on an electronic component mounted member, or the like, a stress generated owing to a difference in coefficient of thermal expansion is absorbed by the stress relaxation mechanism member. Therefore, the electronic component itself or a connection portion between the electronic component and the circuit board is prevented from being destructed, and the reliability of an electronic apparatus can be extremely improved.

What is claimed is:

1. A stress relaxation type electronic component which is to be mounted on a circuit board, wherein a stress relaxation mechanism member is disposed on a surface of said electronic component, said surface being on a side of a connection portion where said electronic component is to be connected to said circuit board, and said stress relaxation mechanism member is electrically conductive, and wherein a solderable layer is on a surface of said stress relaxation mechanism member, said surface being on a side where said stress relaxation mechanism member is connected to said circuit board.

2. A stress relaxation type electronic component according to claim 1, wherein said stress relaxation mechanism member is disposed for each of electrodes which are on said connection portion-side surface of said electronic component, in a manner that said stress relaxation mechanism members are electrically separated from each other.

3. A stress relaxation type electronic component according to claim 1 or 2, wherein said solderable layer consists of copper foil, or a metal which is formed by thermally discomposing organometallic complex film.

4. A stress relaxation type electronic component according to claim 1 or 2, wherein said stress relaxation mechanism member is formed by an electrically conductive adhesive agent.

5. A stress relaxation type electronic component according to claim 1 or 2, wherein said stress relaxation mechanism member is formed by a solderable electrically conductive adhesive agent.

6. A stress relaxation type electronic component according to claim 1, wherein an electrode on said connection portion-side surface functions also as said stress relaxation mechanism member.

7. A stress relaxation type electronic component according to claim 6, wherein said electrode is made of an electrically conductive resin composition.

8. A stress relaxation type electronic component according to claim 7, wherein said electrically conductive resin composition contains, as main components, at least an electrically conductive filler, a thermosetting resin, and expandable hollow synthetic resin particles.

9. A stress relaxation type electronic component according to claim 6 or 7, wherein an electrically conductive adhesive agent for forming a stress relaxation mechanism member is further formed on an upper face of said electrode.

10. A stress relaxation type circuit board on which an electronic component is to be mounted, wherein a stress relaxation mechanism member is disposed on a surface of said circuit board, said surface being on a side of a connection portion where said circuit board is to be connected to said electronic component, and wherein a solderable layer is on a surface of said stress relaxation mechanism member, said surface being on a side where said stress relaxation mechanism member is connected to said electronic component.

11. A stress relaxation type circuit board according to claim 10, wherein said stress relaxation mechanism member is electrically conductive.

12. A stress relaxation type circuit board according to claim 10 or 11, wherein said stress relaxation mechanism member is disposed for each of electrodes which are on said connection portion-side surface of said circuit board, in a manner that said stress relaxation mechanism members are electrically separated from each other.

13. A stress relaxation type circuit board according to claim 10 or 11, wherein plural sets of said electronic components are mounted on said circuit board.

14. A stress relaxation type circuit board according to claim 13, wherein said plural sets of electronic components have different sizes or different shapes.

15. A stress relaxation type circuit board according to claim 10 or 11, wherein said solderable layer consists of copper foil, or a metal which is formed by thermally decomposing an organometallic complex film.

16. A stress relaxation type circuit board according to claim 10 or 11, wherein said stress relaxation mechanism member is formed by an electrically conductive adhesive agent.

17. A stress relaxation type circuit board according to claim 10 or 11, wherein said stress relaxation mechanism member is formed by a solderable electrically conductive adhesive agent.

18. A stress relaxation type circuit board according to claim 10 or 11, wherein an electrode on said connection portion-side surface functions also as said stress relaxation mechanism member.

19. A stress relaxation type circuit board according to claim 10 or 11, wherein said electrode is made of an electrically conductive resin composition.

20. A stress relaxation type circuit board according to claim 10 or 11, wherein said electrically conductive resin composition contains, as main components, at least an electrically conductive filler, a thermosetting resin, and expandable hollow synthetic resin particles.

21. A stress relaxation type circuit board according to claim 10 or 11, wherein a solder layer, or an electrically conductive adhesive agent for forming a stress relaxation mechanism member is further formed on an upper face of said electrode.

22. A stress relaxation type electronic component mounted member wherein an electronic component is mounted on a circuit board via a stress relaxation mechanism member, said stress relaxation mechanism member is electrically conductive, and wherein said stress relaxation mechanism member is configured by an electrically conductive adhesive agent and a solder layer.

23. A stress relaxation type electronic component mounted member according to claim 22, wherein said stress relaxation mechanism member is disposed for each of electrodes which are in said connection portion between said electronic component and said circuit board, in a manner that said stress relaxation mechanism members are electrically separated from each other.

24. A stress relaxation type electronic component mounted member according to claim 22 or 23, wherein said stress relaxation mechanism member functions also as an electrode disposed on said electronic component and/or said circuit board.

25. A stress relaxation type electronic component mounted member according to claim 22 or 23, wherein said stress relaxation mechanism member is configured by an electrode made of an electrically conductive resin composition disposed on said electronic component and/or said circuit board, and at least one of an electrically conductive adhesive agent and a solder layer.

26. A stress relaxation type electronic component mounted member according to claim 22, wherein said electronic component consists of plural electronic components having different sizes or different shapes.

27. A stress relaxation type electronic component mounted member according to claim 22, wherein said electrically conductive adhesive agent and said solder layer are connected to each other via a solderable layer.

* * * * *